(12) United States Patent
Ohmori et al.

(10) Patent No.: US 11,992,896 B2
(45) Date of Patent: May 28, 2024

(54) LASER IRRADIATION APPARATUS, LASER IRRADIATION METHOD, AND SEMICONDUCTOR DEVICE MANUFACTURING METHOD

(71) Applicant: JSW AKTINA SYSTEM CO., LTD., Yokohama (JP)

(72) Inventors: Kenichi Ohmori, Tokyo (JP); Suk-Hwan Chung, Tokyo (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 454 days.

(21) Appl. No.: 17/438,266

(22) PCT Filed: Nov. 15, 2019

(86) PCT No.: PCT/JP2019/044887
§ 371 (c)(1),
(2) Date: Sep. 10, 2021

(87) PCT Pub. No.: WO2020/213200
PCT Pub. Date: Oct. 22, 2020

(65) Prior Publication Data
US 2022/0184734 A1 Jun. 16, 2022

(30) Foreign Application Priority Data
Apr. 16, 2019 (JP) ................................ 2019-077707

(51) Int. Cl.
*B23K 26/067* (2006.01)
*B23K 26/06* (2014.01)
(Continued)

(52) U.S. Cl.
CPC ........ *B23K 26/067* (2013.01); *B23K 26/0604* (2013.01); *B23K 26/0622* (2015.10);
(Continued)

(58) Field of Classification Search
None
See application file for complete search history.

(56) References Cited

U.S. PATENT DOCUMENTS 6,075,604 A * 6/2000 Crawforth ............ G01B 11/255
356/600
6,108,170 A * 8/2000 Crawforth .............. G11B 21/21
977/932

(Continued)

FOREIGN PATENT DOCUMENTS

CN 105206517 A 12/2015
CN 113418932 A * 9/2021
(Continued)

OTHER PUBLICATIONS

Office Action dated Nov. 1, 2022 in Japanese Application No. 2019-077707.
(Continued)

*Primary Examiner* — Michael Lebentritt
(74) *Attorney, Agent, or Firm* — Sughrue Mion, PLLC

(57) ABSTRACT

There are provided a laser irradiation apparatus, a laser irradiation method, and a semiconductor device manufacturing method that reduce irradiation unevenness of a laser beam.
A laser irradiation apparatus includes a waveform shaping device (20). The waveform shaping device (20) includes a laser beam source (11), a first waveform shaping unit (30) that shapes the pulse waveform of a pulse laser beam by applying a delay according to an optical path length difference between two light beams (L11 and L12) branched by a first beam splitter (31), a wave plate that changes the polarization state of the pulse laser beam from the first waveform shaping unit (30), and a second waveform shaping unit (40) that shapes the pulse waveform of the pulse laser beam by applying a delay according to an optical path (Continued)

length difference between two light beams (L15 and L16) branched by a second beam splitter (41).

21 Claims, 15 Drawing Sheets

(51) Int. Cl.
  *B23K 26/0622* (2014.01)
  *H01L 21/268* (2006.01)
  *B23K 101/40* (2006.01)
(52) U.S. Cl.
  CPC ........ *B23K 26/0643* (2013.01); *H01L 21/268* (2013.01); *B23K 2101/40* (2018.08)

(56) References Cited

U.S. PATENT DOCUMENTS

| | | | | |
|---|---|---|---|---|
| 6,321,440 | B1* | 11/2001 | Crawforth | G11B 5/60 |
| | | | | 29/603.12 |
| 2010/0108913 | A1* | 5/2010 | Ershov | H01S 3/225 |
| | | | | 250/492.1 |
| 2012/0305774 | A1* | 12/2012 | Kiwa | G01T 1/24 |
| | | | | 250/341.1 |
| 2013/0210242 | A1 | 8/2013 | Shida et al. | |
| 2015/0053658 | A1 | 2/2015 | Adams et al. | |
| 2015/0372446 | A1 | 12/2015 | Chuang et al. | |
| 2016/0248219 | A1 | 8/2016 | Wakabayashi et al. | |
| 2018/0019141 | A1 | 1/2018 | Ohkubo et al. | |
| 2019/0198322 | A1 | 6/2019 | Ito et al. | |
| 2019/0267240 | A1 | 8/2019 | Ohmori et al. | |
| 2019/0271871 | A1 | 9/2019 | Chung et al. | |
| 2023/0243935 | A1* | 8/2023 | Qiu | G01S 17/931 |
| | | | | 356/5.01 |

FOREIGN PATENT DOCUMENTS

| | | | | |
|---|---|---|---|---|
| CN | 113433708 | A * | 9/2021 | |
| CN | 109478244 | B * | 8/2022 | ............ G06K 1/02 |
| JP | 2006-186046 | A | 7/2006 | |
| JP | 2009-31634 | A | 2/2009 | |
| JP | 2012-015445 | A | 1/2012 | |
| JP | 2013-211415 | A | 10/2013 | |
| JP | 2017-525144 | A | 8/2017 | |
| JP | 2018-018866 | A | 2/2018 | |
| JP | 2018-037646 | A | 3/2018 | |
| JP | 2018-060927 | A | 4/2018 | |
| TW | 201820415 | A | 6/2018 | |
| WO | 2015/092855 | A1 | 6/2015 | |
| WO | 2016/147308 | A1 | 9/2016 | |

OTHER PUBLICATIONS

International Search Report for PCT/JP2019/044887 dated Feb. 10, 2020 [PCT/ISA/210].
Written Opinion for PCT/JP2019/044887 dated Feb. 10, 2020 [PCT/ISA/237].
Japanese Office Action dated Mar. 28, 2023 in Japanese Application No. 2019-077707.
Office Action dated Feb. 21, 2023 from Taiwan Patent Office in Application No. 108145865.

* cited by examiner

LASER IRRADIATION APPARATUS, LASER IRRADIATION METHOD, AND SEMICONDUCTOR DEVICE MANUFACTURING METHOD

CROSS-REFERENCE TO RELATED APPLICATIONS

This application is a National Stage of Application No. PCT/JP2019/044887 filed Nov. 15, 2019, claiming priority based on Japanese Patent Application No. 2019-077707 filed Apr. 16, 2019, the contents of which are incorporated herein by references.

TECHNICAL FIELD

The present invention relates to a laser irradiation apparatus, a laser irradiation method, and a semiconductor device manufacturing method.

BACKGROUND ART

Patent Literature 1 discloses a laser annealing apparatus for forming a poly-silicon thin film. FIG. 2 in Patent Literature 1 shows a waveform shaping device that shapes the waveform of a laser beam pulse.

CITATION LIST

Patent Literature

Patent Literature 1: Japanese Unexamined Patent Application Publication No. 2012-15445

SUMMARY OF INVENTION

Technical Problem

It is desired that such a laser irradiation apparatus further reduces irradiation unevenness of a laser beam.

Other problems and novel features will be clarified from the description of this specification and the attached drawings.

Solution to Problem

According to one embodiment, a laser irradiation apparatus includes a first waveform shaping unit including a first beam splitter that branches a pulse laser beam, the first waveform shaping unit that shapes a pulse waveform of the pulse laser beam by applying a delay according to an optical path length difference between two light beams branched by the first beam splitter, a wave plate that changes a polarization state of the pulse laser beam from the first waveform shaping unit, and a second waveform shaping unit including a second beam splitter that branches the pulse laser beam from the wave plate, the second waveform shaping unit that shapes the pulse waveform of the pulse laser beam by applying a delay according to an optical path length difference between two light beams branched by the second beam splitter.

According to one embodiment, a laser irradiation apparatus includes a first waveform shaping unit including a first beam splitter that branches a first pulse laser beam, the first waveform shaping unit that shapes a pulse waveform of the first pulse laser beam by applying a delay according to an optical path length difference between two light beams branched by the first beam splitter, a first wave plate that changes a polarization state of the first pulse laser beam from the first waveform shaping unit, a second wave plate that changes a polarization state of the second pulse laser beam, a second waveform shaping unit including a second beam splitter that branches the second pulse laser beam from the second wave plate, the second waveform shaping unit that shapes a pulse waveform of the second pulse laser beam by applying a delay according to an optical path length difference between two light beams branched by the second beam splitter, and a combiner that combines the first pulse laser beam from the first wave plate with the second pulse laser beam from the second waveform shaping unit.

According to one embodiment, a laser irradiation method includes the steps of (B) branching the pulse laser beam into two light beams by a first beam splitter, (C) shaping a pulse waveform of the pulse laser beam by applying a delay according to an optical path length difference between the two light beams branched by the first beam splitter, (D) changing, after the step (C), a polarization state of the pulse laser beam by a wave plate, (E) branching the pulse laser beam from the wave plate into two light beams by a second beam splitter, and (F) shaping the pulse waveform of the pulse laser beam by applying a delay according between an optical path length difference to the two light beams branched by the second beam splitter.

According to one embodiment, a laser irradiation method includes the steps of (b) branching the first pulse laser beam into two light beams by a first beam splitter, (c) shaping a pulse waveform of the first pulse laser beam by applying a delay according to an optical path length difference between the two light beams branched by the first beam splitter, (d) changing, after the step (c), a polarization state of the first pulse laser beam by a first wave plate, (e) changing a polarization state of a second pulse laser beam by a second wave plate, (f) branching, after the step (e), the second pulse laser beam into two light beams by a second beam splitter, and (g) shaping a pulse waveform of the second pulse laser beam by applying a delay according to an optical path length difference between the two light beams branched by the second beam splitter.

According to one embodiment, a semiconductor device manufacturing method includes the step of (S2) irradiating the amorphous film with a pulse laser beam in such a manner as to form a crystallized film by crystallizing the amorphous film, in which the step (S2) includes the steps of (SC) shaping a pulse waveform of the pulse laser beam by applying a delay according to an optical path length difference between the two light beams branched by the first beam splitter, (SD) changing, after the step (SC), a polarization state of the pulse laser beam by a wave plate, and (SF) shaping the pulse waveform of the pulse laser beam by applying a delay according to an optical path length difference between the two light beams branched by the second beam splitter.

According to one embodiment, a semiconductor device manufacturing method includes the step of (S2) irradiating the amorphous film with a pulse laser beam in such a manner as to form a crystallized film by crystallizing the amorphous film, in which the step (S2) includes the steps of (sc) shaping a pulse waveform of the first pulse laser beam by applying a delay according to an optical path length difference between the two light beams branched by the first beam splitter, (sd) changing, after the step (sc), a polarization state of the first pulse laser beam by a first wave plate, (se) changing a polarization state of a second pulse laser beam by a second wave plate, and (sg) shaping a pulse waveform of the second pulse laser beam by applying a delay according to an optical path length difference between the two light beams branched by the second beam splitter.

Advantageous Effects of Invention

According to the one embodiment, it is possible to reduce irradiation unevenness.

DESCRIPTION OF EMBODIMENTS

First Embodiment

A laser irradiation apparatus according to the present embodiment is, for example, an excimer laser annealing (ELA) apparatus that forms a low temperature poly-silicon (LTPS) film. Hereinafter, a laser irradiation apparatus, a laser irradiation method, and a manufacturing method according to the present embodiment are described with reference to the drawings.

Optical System of ELA Apparatus

Figure 1:
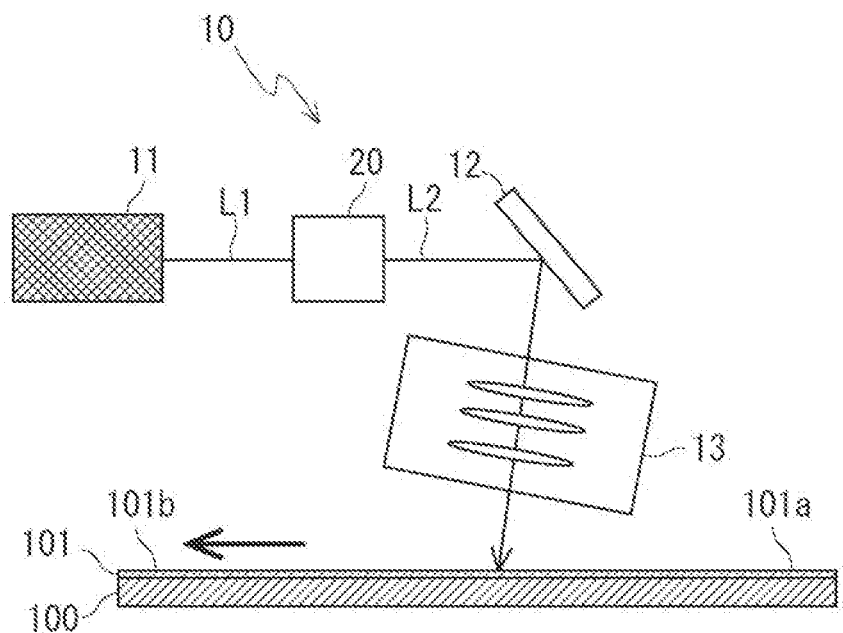
FIG. 1 is a diagram showing an optical system of a laser annealing apparatus according to the present embodiment.

With reference to FIG. 1, a configuration of an ELA apparatus 1 according to the present embodiment is described. FIG. 1 is a diagram schematically showing an optical system of the ELA apparatus 1. The ELA apparatus 1 irradiates a silicon film 101 formed on a substrate 100 with a laser beam L2. This converts an amorphous silicon film (a-Si film) 101 into a poly-silicon film (p-Si film) 101. The substrate 100 is, for example, a transparent substrate, such as a glass substrate.

Note that, an XYZ three-dimensional orthogonal coordinate system is shown in FIG. 1 to clarify the description. The Z direction is the vertical direction and is the direction perpendicular to the substrate 100. The XY plane is a plane parallel to the face on which the silicon film 101 of the substrate 100 is formed. The X direction is the longitudinal direction of the rectangular substrate 100, and the Y direction is the latitudinal direction of the substrate 100. In addition, the ELA apparatus 1 irradiates the silicon film 101 with the laser beam L2 while a conveyance mechanism (not shown), such as a stage, is conveying the substrate 100 in the +X direction. Note that, with regard to the silicon film 101 in FIG. 1, the silicon film 101 before irradiation with the laser beam L2 is shown as an amorphous silicon film 101a, and the silicon film 101 after irradiation with the laser beam L2 is shown as a poly-silicon film 101b.

The ELA apparatus 1 includes an annealing optical system 10. The annealing optical system 10 is an optical system that irradiates the silicon film 101 with the laser beam L2 to crystallize the amorphous silicon film 101a.

Specifically, the annealing optical system 10 includes a laser beam source 11, a mirror 12, a projection lens 13, and a waveform shaping device 20.

The annealing optical system 10 is disposed above the substrate 100 (on the +Z side). The laser beam source 11 is a pulse laser beam source and generates a pulse laser beam. The laser beam source 11 is, for example, an excimer laser beam source that emits an excimer laser beam having a center wavelength of 308 nm. In addition, the laser beam source 11 emits a pulse-like laser beam L1. The laser beam source 11 emits the laser beam L1 toward the waveform shaping device 20.

The laser beam L1 enters the waveform shaping device 20. The waveform shaping device 20 shapes a pulse waveform on a time axis. More specifically, the waveform shaping device 20 expands the pulse width of the laser beam L1. A configuration of the waveform shaping device 20 is described later. The laser beam L1 shaped by the waveform shaping device 20 is referred to as the laser beam L2. The laser beam L2 from the waveform shaping device 20 enters the mirror 12.

The mirror 12 and the projection lens 13 are disposed above the substrate 100. The mirror 12 is, for example, a dichroic mirror that selectively transmits light according to the wavelength. The mirror 12 reflects the laser beam L2.

The laser beam L2 is reflected by the mirror 12 and enters the projection lens 13. The projection lens 13 includes a plurality of lens for projecting the laser beam L2 on the substrate 100, that is, on the silicon film 101.

The projection lens 13 condenses the laser beam L2 on the substrate 100. The laser beam L2 forms a linear irradiation region on the substrate 100. In other words, the laser beam L2 is a line beam along the Y direction on the substrate 100. That is, the laser beam L2 condensed on the substrate 100 forms a linear illumination region having its longitudinal direction (long-axis direction) in the Y direction and its latitudinal direction (short-axis direction) in the X direction. In addition, the silicon film 101 is irradiated with the laser beam L1 while the substrate 100 is being conveyed in the +X direction. Accordingly, a belt-shaped region having the length of the irradiation region in the Y direction as its width can be irradiated with the laser beam L2.

Irradiation with the laser beam L2 crystallizes the amorphous silicon film 101a. While changing the irradiation position of the laser beam L2 to the substrate 100, the silicon film 101 is irradiated with the laser beam L2. By the conveyance mechanism (not shown) conveying the substrate 100 in the +X direction, the uniform poly-silicon film 101b is formed on the substrate 100. Needless to say, instead of conveying the substrate 100, an optical system, such as a projection lens, may be moved. That is, it is only required to scan the irradiation region of the laser beam L2 by relatively moving a substrate and an optical system.

Waveform Shaping Device 20

Figure 2:
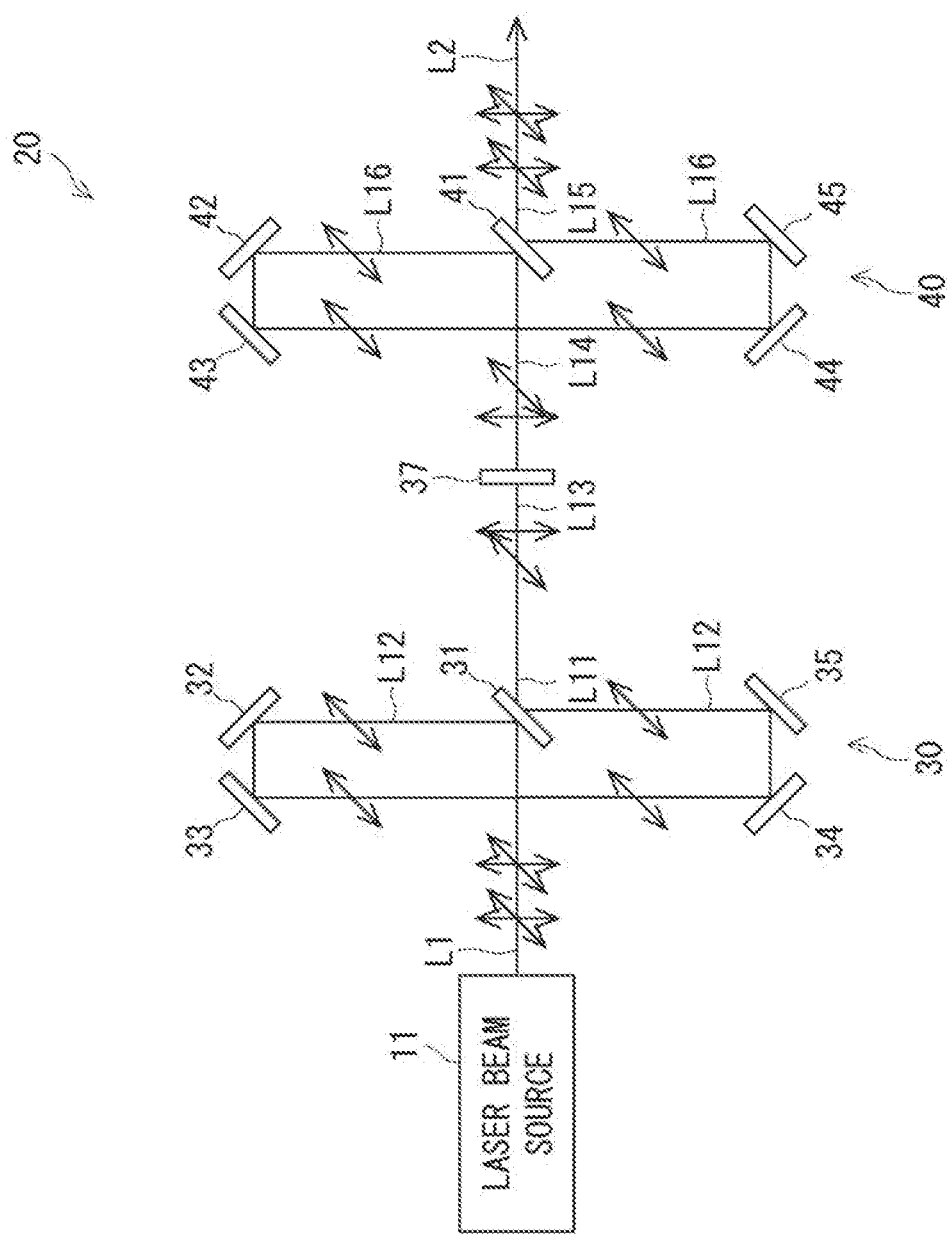
FIG. 2 is a diagram showing an optical system of a waveform shaping device according to a first embodiment.

Next, the waveform shaping device 20 is described with reference to FIG. 2. FIG. 2 is a diagram showing an optical system of the waveform shaping device 20. The waveform shaping device 20 includes a first waveform shaping unit 30, a half-wave plate 37, and a second waveform shaping unit 40. The first waveform shaping unit 30, the half-wave plate 37, and the second waveform shaping unit 40 are disposed in this order from the laser beam source 11 side. The waveform shaping device 20 has a two-stage structure in which the first waveform shaping unit 30 and the second waveform shaping unit 40 are disposed in series.

The first waveform shaping unit 30 and the second waveform shaping unit 40 are pulse expanders that expand a pulse width. The first waveform shaping unit 30 includes a first beam splitter 31 and mirrors 32 to 35. Similarly, the second waveform shaping unit 40 includes a second beam splitter 41 and mirrors 42 to 45. The half-wave plate 37 is disposed on the optical path between the first waveform shaping unit 30 and the second waveform shaping unit 40.

The laser beam L1 from the laser beam source 11 has a specific polarization ratio. That is, the laser beam L1 contains a first polarization component and a second polarization component. The first polarization component and the second polarization component are polarization components orthogonal to each other. That is, when directions orthogonal to each other in the plane orthogonal to the optical axis are a first direction and a second direction, the first polarization component is a linear polarization component parallel to the first direction, and the second polarization component is a linear polarization component parallel to the second direction. The electric field vector of the first polarization component oscillates along the first direction, and the electric field vector of the second polarization component oscillates along the second direction.

The first polarization component is an S-polarization component with respect to the substrate 100, and the second polarization component is a P-polarization component with respect to the substrate 100. In addition, the longitudinal direction of the line beam is parallel to the first direction, and the latitudinal direction is the second direction. Thus, S polarization is parallel to the longitudinal direction of the line beam, and P polarization is parallel to the latitudinal direction of the line beam.

In the laser beam L1, the intensity of the second polarization component is larger than the intensity of the first polarization component. For example, the percentage of the first polarization component in the laser beam L1 is 30% to 40%, and the percentage of the second polarization component is 60% to 70%. The ratio of the first polarization component to the entire pulse light beam is referred to as a polarization ratio and is expressed as (first polarization component)/(first polarization component+second polarization component). The polarization ratio in the laser beam L1 is (first polarization component)/(first polarization component+second polarization component)=30% to 40%.

The laser beam L1 first enters the first beam splitter 31 of the first waveform shaping unit 30. The first beam splitter 31 is, for example, a plate-type beam splitter and is disposed to be inclined to the optical axis of the laser beam L1 by 45°. The first beam splitter 31 transmits a part of incident light and reflects a part of the incident light to branch the laser beam L1 into two light beams L11 and L12. The light beam transmitted through the first beam splitter 31 is referred to as a light beam L11, and the light beam reflected by the beam splitter is referred to as a light beam L12. The first beam splitter 31 is a half mirror and has transmittance of 50% and reflectance of 50% for non-polarization. The first beam splitter 31 is not limited to a plate type and may be a cube type.

The first beam splitter 31 transmits a part of the first polarization component and reflects a part of the first polarization component. Similarly, the first beam splitter 31 transmits a part of the second polarization component and reflects a part of the second polarization component. The first beam splitter 31 is, for example, an unpolarizing beam splitter and has specific polarization characteristics. In the first beam splitter 31, the branching ratio of the first polarization component is different from the branching ratio of the second polarization component. Note that, a branching ratio at a beam splitter is an intensity ratio between reflected light and transmitted light at the beam splitter. In other words, in the first beam splitter 31, the transmittance for the first polarization component is different from the transmittance for the second polarization component. In the first beam splitter 31, the reflectance for the first polarization component is different from the reflectance for the second polarization component.

Thus, the polarization ratio in the light beam L11 is different from the polarization ratio in the light beam L12. For example, in the first beam splitter 31, the reflectance for the second polarization component is higher than the reflectance for the first polarization component. In the first beam splitter 31, the transmittance for the second polarization component is lower than the transmittance for the first polarization component. For this reason, if the laser beam L1 is reflected by the first beam splitter 31, the second polarization component is relatively high in the reflected light beam L12. If the laser beam L1 is transmitted through the first beam splitter 31, the first polarization component is relatively high in the light beam L11. The polarization ratio is expressed as (first polarization component)/(first polarization ratio+second polarization component), and the polarization ratio in the light beam L11 is larger than the polarization ratio in the light beam L12.

The first beam splitter 31 reflects the light beam L12 toward the mirror 32. The mirrors 32 to 35 are total reflection mirrors that reflect almost all incident light and disposed to be inclined to the optical axis by 45°. The light beam L12 reflected by the first beam splitter 31 is reflected by the mirror 32, the mirror 33, the mirror 34, and the mirror 35 in this order. The light beam L12 reflected by the mirror 35 enters the first beam splitter 31. The first beam splitter 31 has the specific polarization characteristics as described above and transmits a part of the light beam L12 and reflects a part of the light beam L12.

A part of the light beam L12 is reflected by the first beam splitter 31 toward the half-wave plate 37. The light beam L12 reflected by the first beam splitter 31 again is combined with the light beam L11 transmitted through the first beam splitter 31. In the planar view orthogonal to the optical axis, the light beam L12 reflected by the mirror 35 and the first beam splitter 31 overlaps the light beam L11 transmitted through the first beam splitter 31. The light beam L12 is reflected by the first beam splitter 31 again and then becomes a light beam coaxial with the light beam L11. The light beam obtained by combining the light beams L11 and L12 by the first beam splitter 31 is referred to as a laser beam L13.

The optical path between being branched by the first beam splitter 31 and entering the first beam splitter 31 again through the mirror 32 to the mirror 35 is referred to as a delay path. The optical path length of the delay path corresponds to, for example, 16 nsec.

Between the two light beams L11 and L12 combined by the first beam splitter 31, a time delay according to the optical path length difference is applied. That is, the light beam L12 is repeatedly reflected by the mirror 32 to the mirror 35 and then combined with the light beam L11 by the first beam splitter 31. The light beam L12 is delayed by the optical path length of the delay path as compared with the light beam L11. The pulse length of the laser beam L13 after shaping is longer than the pulse length of the laser beam L1 before shaping. The first waveform shaping unit 30 uses the optical path length difference between the light beam L11 and the light beam L12 to expand the pulse width of the laser beam L13.

In addition, a part of the light beam L12 entering the first beam splitter 31 again is transmitted through the first beam splitter 31. The light beam L12 transmitted through the first beam splitter 31 is reflected by the mirror 32 to the mirror 35 and enters the first beam splitter 31 again. In this manner, a part of the light beam L12 repeatedly passes through the delay path and combined with the light beam L11. A part of the light beam L12 repeats being branched by the first beam splitter 31 and passing through the delay path a plurality of times. The light beam L12 is delayed by the number of times of passing through the delay path and combined with the light beam L11. For example, the light beam L12 passing through the delay path once is delayed by 16 nsec as compared to the light beam L11, and the light beam L12 passing twice is delayed by 32 nsec as compared to the light beam L11. In addition, the light amount of the light beam L12 passing through the delay path decreases each time the light beam L12 is branched by the first beam splitter 31.

The first waveform shaping unit 30 includes the first beam splitter 31 that branches the laser beam L1 into the two light beams L11 and L12 by reflecting a part of the laser beam L1 and transmitting a part of the laser beam L1. The first waveform shaping unit 30 shapes the pulse waveform by applying a time delay according to the optical path length difference between the two light beams L11 and L12. Specifically, the light beam L12 branched by the first beam splitter 31 repeatedly passes through the delay path until entering the first beam splitter 31 again, whereby the pulse width can be expanded.

The laser beam L13 from the first waveform shaping unit 30 is transmitted through the half-wave plate 37. The half-wave plate 37 is a birefringent element that generates a phase difference between the polarization components orthogonal to each other and changes the polarization state of the laser beam L13. The laser beam transmitted through the half-wave plate 37 is referred to as a laser beam L14. In the plane orthogonal to the optical axis, the optical axis of the half-wave plate 37 is inclined to the first direction by 45°. Thus, the half-wave plate 37 rotates each of the first and second polarization components by 90°. The half-wave plate 37 converts the first polarization component into the second polarization component and converts the second polarization component into the first polarization component. The polarization ratio in the laser beam L14 is reversed. If the polarization ratio in the laser beam L13 is 30%, the polarization ratio in the laser beam L14 is 70% (=100−30).

The laser beam L14 transmitted through the half-wave plate 37 enters the second waveform shaping unit 40. The second waveform shaping unit 40 has a structure similar to the first waveform shaping unit 30. The second beam splitter 41 and the mirror 42 to the mirror 45 of the second waveform shaping unit 40 correspond to the first beam splitter 31 and the mirror 32 to the mirror 35 of the first waveform shaping unit 30, respectively. For example, the arrangement of the second beam splitter 41 and the mirror 42 to the mirror 45 is the same as the arrangement of the first beam splitter 31 and the mirror 32 to the mirror 35. The delay path in the first waveform shaping unit 30 and the delay path in the second waveform shaping unit 40 are substantially the same optical path length. The mirror 42 to the mirror 45 are total reflection mirrors and each are inclined to the optical axis by 45°.

The second beam splitter 41 can use an unpolarizing beam splitter similar to the first beam splitter 31. Thus, the second beam splitter 41 transmits a part of the laser beam L14 and reflects a part of the laser beam L14 to branch the laser beam L14 into two light beams L15 and L16. Then, the light beam L16 reflected by the second beam splitter 41 is reflected by the mirrors 42 to 45 and then enters the second beam splitter 41 again. The second beam splitter 41 combines the light beam L16 reflected by the mirror 45 with the light beam L15 transmitted through the second beam splitter 41. Between the two light beams L15 and L16, a delay time according to the optical path length of the delay path from the mirror 42 to the mirror 45 is applied.

In this manner, the second waveform shaping unit 40 branches the laser beam L14 into the two light beams L15 and L16 by reflecting a part of the laser beam L14 and transmitting a part of the laser beam L14. The second waveform shaping unit 40 has a structure similar to the first waveform shaping unit 30, and the detailed description thereof is omitted. The second waveform shaping unit 40 shapes the pulse waveform of the pulse laser beam by applying a time delay according to the optical path length difference between the two light beams L15 and L16. Specifically, the light beam L16 branched by the second beam splitter 41 repeatedly passes through the delay path until entering the second beam splitter 41 again, whereby the pulse width can be expanded.

Then, the laser beam from the second waveform shaping unit 40 is the laser beam L2 in FIG. 1 and enters the mirror 12. With the laser beam L2, the silicon film 101 is irradiated through the projection lens 13.

The first beam splitter 31 and the second beam splitter 41 have the same polarization characteristics. The first beam splitter 31 and the second beam splitter 41 have the same polarization characteristics of transmittance and reflectance. The first beam splitter 31 and the second beam splitter 41 have the same the branching ratio of the first polarization component. The first beam splitter 31 and the second beam splitter 41 have the same branching ratio of the second polarization component. For example, the first beam splitter 31 and the second beam splitter 41 have the same transmittance for the first polarization component. The first beam splitter 31 and the second beam splitter 41 have the same transmittance for the second polarization component. In addition, the delay path in the second waveform shaping unit 40 has the same optical path length as the delay path in the first waveform shaping unit 30.

Thus, the second waveform shaping unit 40 can expand the pulse width similarly to the first waveform shaping unit 30. In addition, the half-wave plate 37 is disposed between the first waveform shaping unit 30 and the second waveform shaping unit 40. Thus, the first polarization component and the second polarization component in the first waveform shaping unit 30 are reversed in the second waveform shaping unit 40. That is, the first polarization component in the first waveform shaping unit 30 is the second polarization component in the second waveform shaping unit 40. The second polarization component in the first waveform shaping unit 30 is the first polarization component in the second waveform shaping unit 40.

The pulse waveform of the laser beam L1 is shaped by the first waveform shaping unit 30 and the second waveform shaping unit 40, whereby a similar time delay is applied between the S-polarization component and the P-polarization component with respect to the substrate 100. In the laser beam L2 with which the substrate 100 is irradiated, the pulse shape of the S-polarization component and the pulse shape of the P-polarization component become similar. In this manner, by using the first waveform shaping unit 30, the half-wave plate 37, and the second waveform shaping unit 40, it is possible to apply a similar time delay between the polarization components of the laser beam L1 orthogonal to each other.

Figure 3:
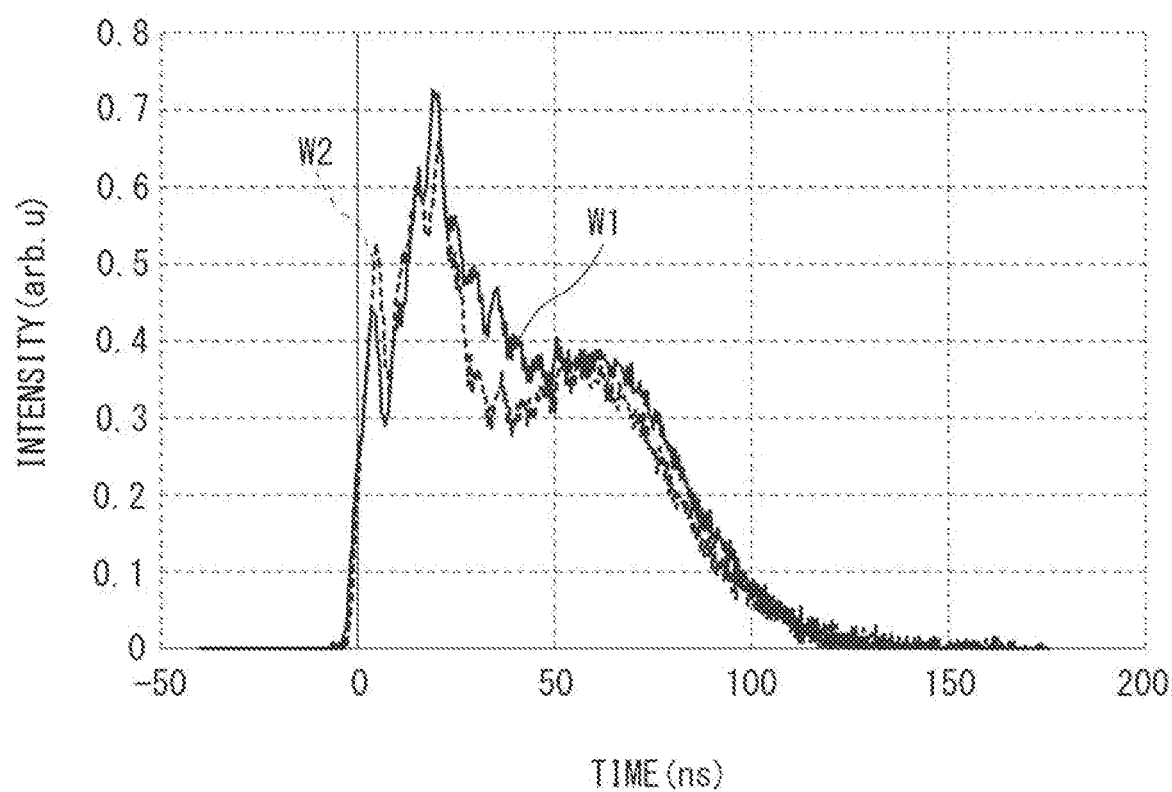
FIG. 3 is a diagram showing pulse waveforms of a P-polarization component and an S-polarization component.
Figure 4:
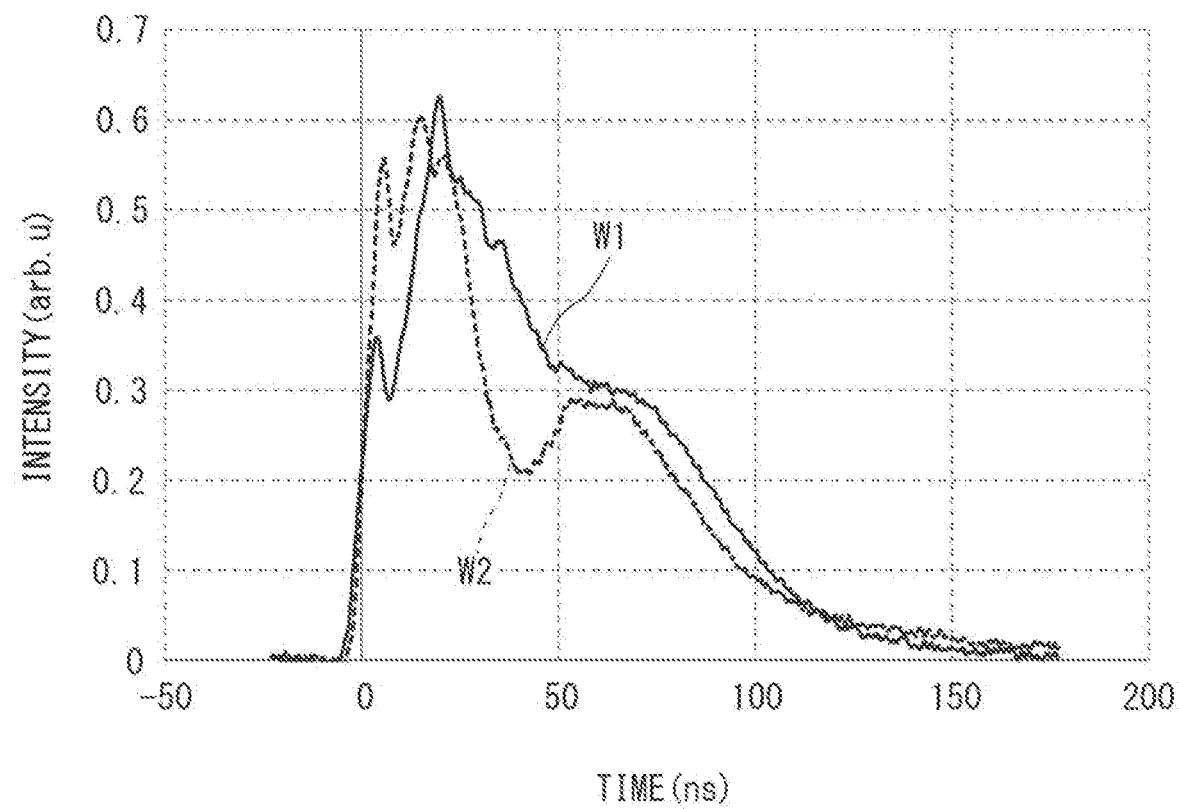
FIG. 4 is a graph showing pulse waveforms of a P-polarization component and an S-polarization component.

FIG. 3 is a graph showing pulse waveforms shaped by the waveform shaping device 20 according to the present embodiment. FIG. 4 is a graph showing pulse waveforms shaped by a waveform shaping device according to a comparative example. As the comparative example, the waveform shaping device shown in FIG. 2 of Patent Literature 1 is used. In FIGS. 3 and 4, the horizontal axis indicates time, and the vertical axis indicates laser beam intensity. In addition, in FIGS. 3 and 4, W1 indicates a P-polarization component, that is, a linear polarization component parallel to the latitudinal direction of a line beam, and W2 indicates a S-polarization component, that is, a linear polarization component parallel to the longitudinal direction of the line beam. In addition, in FIGS. 3 and 4, the intensity of the S-polarization component and the intensity of the P-polarization component are normalized by pulse energy. That is, at least one of the S-polarization component and the P-polarization component is multiplied by a certain coefficient in order for the areas of the S-polarization component and the P-polarization component to be the same in one pulse, whereby the light intensity is normalized.

By using the waveform shaping device 20 according to the present embodiment, it is possible to reduce the temporal change in the polarization ratio in the laser beam with which the amorphous silicon film 101a is irradiated. That is, variation in the polarization ratio between the S-polarization component and the P-polarization component is reduced in the pulse waveform. In the processes of melting and crystallizing, it is possible to reduce the influence on polarization. Accordingly, it is possible to reduce irradiation unevenness. For example, while the substrate 100 is being moved, the substrate 100 is irradiated with the pulse laser beam. Thus, if the polarization ratio largely changes at each irradiation position, uneven crystallization can be caused. In contrast, according to the present embodiment, it is possible to prevent uneven crystallization.

According the present embodiment, it is possible for the intensity difference (hereinafter, referred to as a polarization-ratio difference) between the S-polarization component and the P-polarization component to be less than 12% at any time. For example, in FIG. 3, the maximum polarization-ratio difference is less than 10%. That is, the intensity difference between the S-polarization component and the P-polarization component is less than 10% at any timing of the pulse in FIG. 3. In FIG. 4, the maximum polarization-ratio difference is 22%. As described, it is possible to reduce the polarization-ratio difference, which is the intensity difference between the S-polarization component and the P-polarization component in the laser pulse.

Figure 5:
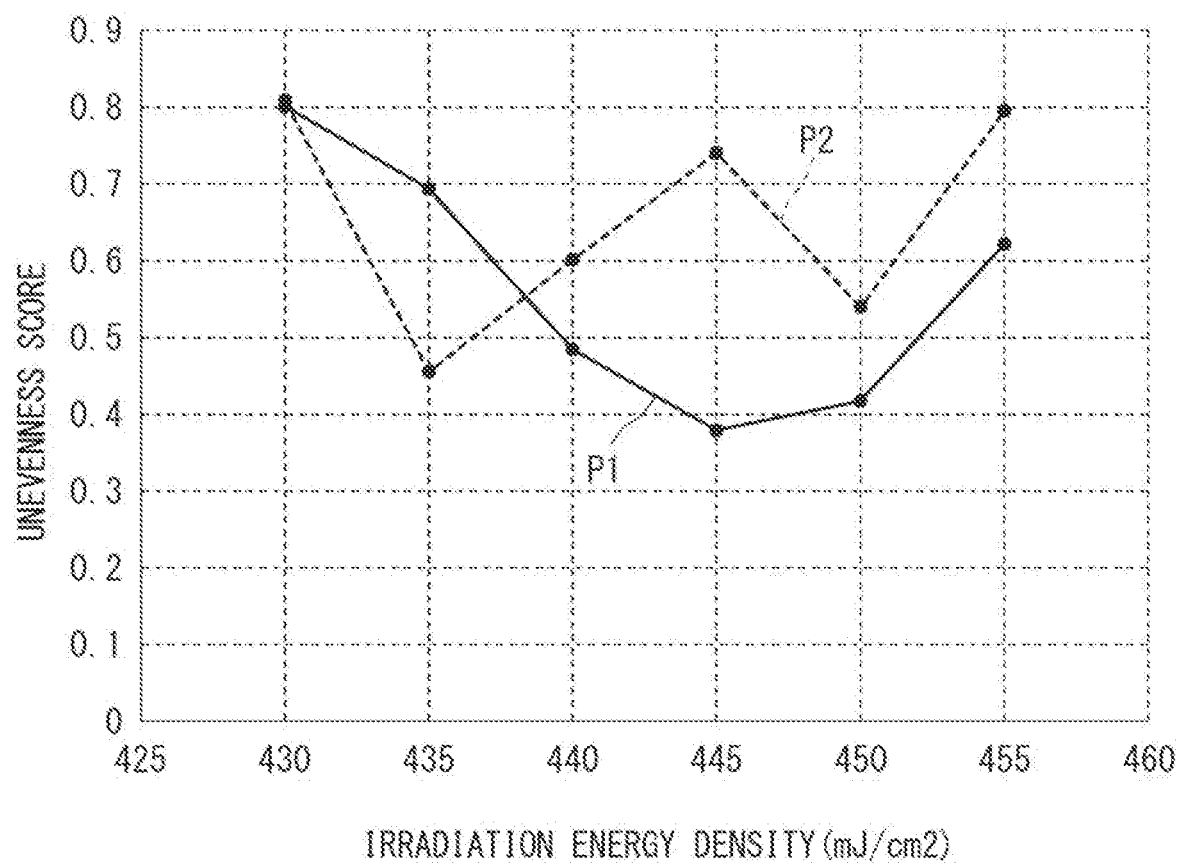
FIG. 5 is a graph showing an evaluation result of evaluating irradiation unevenness of a laser beam while changing an irradiation energy density.

FIG. 5 is a diagram showing an evaluation result of irradiation unevenness in the pulse waveforms in FIGS. 3 and 4. The evaluation result of the pulse waveform in FIG. 3 is indicated as P1, and the evaluation result of the pulse waveform in FIG. 4 is indicated as P2. The horizontal axis in FIG. 5 indicates the irradiation energy density of a laser beam, and the vertical axis indicates the unevenness scores. The unevenness scores are values obtained by evaluating unevenness of the crystallized poly-silicon film 101b, and lower values indicate less unevenness. FIG. 5 shows the evaluation result obtained by changing the irradiation energy density of the laser beam in the range of 430 mJ/cm$^2$ to 455 mJ/cm$^2$ in increments of 5 mJ/cm$^2$.

As indicated by the evaluation result P1, by using the pulse laser beam shaped by the waveform shaping device 20, it is possible to obtain low unevenness scores in the range of 440 mJ/cm$^2$ to 450 mJ/cm$^2$. That is, although the irradiation energy of the pulse laser beam varies during the process, it is possible to reduce the unevenness crystal structure of the poly-silicon film 101b. On the other hand, in the evaluation result P2, the irradiation energy density with which an unevenness score is lowered is only 435 mJ/cm$^2$. Thus, in the comparative example, the process margin for irradiation energy variation is small.

According the present embodiment, it is possible to increase the margin for the irradiation energy density in the processes of melting and crystallizing. It is possible to form a poly-silicon film having a more even crystal structure. Accordingly, it is possible to improve the performance of the semiconductor device.

In addition, it is preferable that the P-polarization component is higher than the S-polarization component in the laser beam L2. That is, it is preferable that the polarization ratio in the laser beam L2 is set to be 50% or more. In addition, an irradiation object with the laser beam L2 is not limited to the substrate 100 including the amorphous silicon film 101a. That is, the above waveform shaping device 20 is applicable to a laser irradiation apparatus other than the laser annealing apparatus.

Second Embodiment

Figure 6:
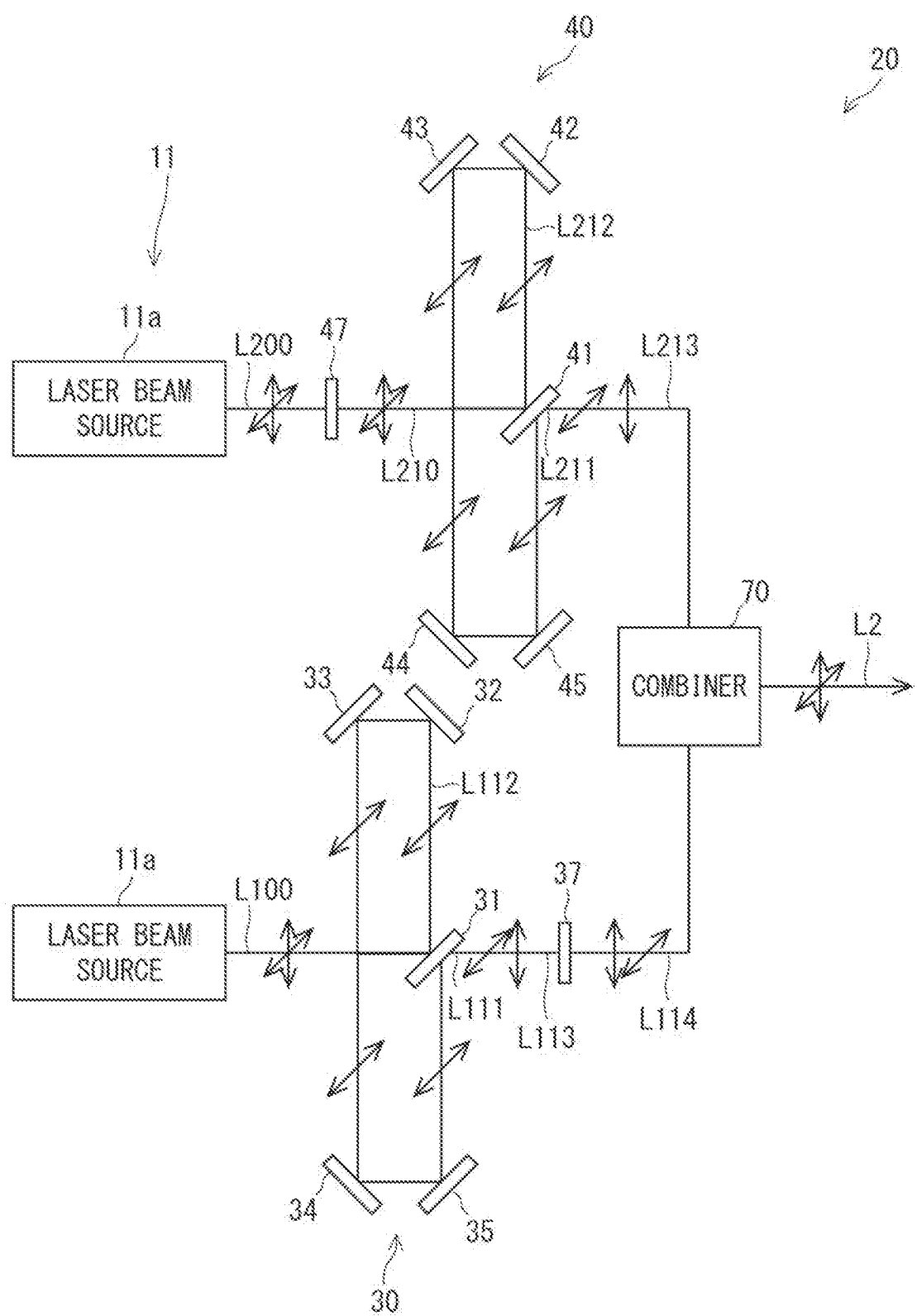
FIG. 6 is a diagram showing an optical system of a waveform shaping device according to a second embodiment.

The present embodiment is described with reference to FIG. 6. FIG. 6 is a diagram showing a configuration of a waveform shaping device 20. Note that, a basic configuration of an ELA apparatus 1 is similar to that in the first embodiment, and the description there of is appropriately omitted. In the present embodiment, a first waveform shaping unit 30 and a second waveform shaping unit 40 are disposed in parallel. Note that, basic configurations of the first waveform shaping unit 30 and the second waveform shaping unit 40 are similar to those in the first embodiment, and detailed description thereof is omitted.

In the present embodiment, two laser beam sources are used. Specifically, a laser beam source 11 includes a first laser beam source 11a and a second laser beam source 11b. The first laser beam source 11a and the second laser beam source 11b are similar laser oscillators. For example, the first laser beam source 11a and the second laser beam source 11b are excimer lasers similarly to the first embodiment and each emit a pulse laser beam having a wavelength of 308 nm. A laser beam generated by the first laser beam source 11a is referred to as a laser beam L100, and a laser beam generated by the second laser beam source 11b is referred to as a laser beam L200. The laser beam L100 and the laser beam L200 have the same polarization ratio.

The laser beam L100 enters a combiner 70 through the first waveform shaping unit 30 and a half-wave plate 37. The first waveform shaping unit 30 and the half-wave plate 37 are disposed similarly to the first waveform shaping unit 30 and the half-wave plate 37 in the first embodiment. A first beam splitter 31 branches the laser beam L100 into two light beams L111 and L112. The light beam L112 reflected by the first beam splitter 31 is reflected by mirrors 32 to 35 and enters the first beam splitter 31. Thus, the first beam splitter 31 combines the light beam L112 with the light beam L111 transmitted through the first beam splitter 31.

The light beam obtained by combining the light beams L111 and L112 by the first beam splitter 31 is referred to as a laser beam L113. The laser beam L113 is transmitted through the half-wave plate 37. The laser beam L113 transmitted though the half-wave plate 37 is referred to as a laser beam L114. The laser beam L114 enters the combiner 70.

The first waveform shaping unit 30 shapes the pulse waveform by applying a time delay according to the optical path length difference between the two light beams L111 and L112. Specifically, the light beam L112 branched by the first beam splitter 31 repeatedly passes through the delay path until entering the first beam splitter 31 again, whereby the pulse width can be expanded.

The laser beam L200 enters the combiner 70 through a half-wave plate 47 and the second waveform shaping unit 40. The half-wave plate 47 is disposed at a preceding stage of the second waveform shaping unit 40. The arrangement of the half-wave plate 47 and the second waveform shaping unit 40 in FIG. 6 are the same as the arrangement of the half-wave plate 37 and the second waveform shaping unit 40 in FIG. 2.

The half-wave plate 47 changes the polarization state of the laser beam L200. The laser beam L200 transmitted through the half-wave plate 47 is referred to as a laser beam L210. The half-wave plate 47 is similar to the half-wave plate 37. In other words, in the plane orthogonal to the optical axis of the laser beam L200, the optical axis of the half-wave plate 47 is inclined to the first direction by 45°. The half-wave plate 47 converts the first polarization component into the second polarization component and converts the second polarization component into the first polarization component. The polarization ratios in the laser beam L200 and the laser beam L210 are reversed. If the polarization ratios in the laser beam L100 and the laser beam L200 are the same, the polarization ratio in the laser beam L210 is {1−(polarization ratio in laser beam L100)}. For example, if the polarization ratio in the laser beam L100 is 30%, the polarization ratio in the laser beam L210 is 70%.

A second beam splitter 41 branches the laser beam L210 into two light beams L211 and L212. The light beam L212 reflected by the second beam splitter 41 is reflected by mirrors 42 to 45 and enters the second beam splitter 41. Thus, the second beam splitter 41 combines the light beam L212 with the light beam L211 transmitted through the second beam splitter 41.

The light beam obtained by combining the light beams L211 and L212 by the second beam splitter 41 is referred to as a laser beam L213. The laser beam L213 enters the combiner 70. The second waveform shaping unit 40 shapes the pulse waveform by applying a time delay according to the optical path length difference between the two light beams L211 and L212. Specifically, the light beam L212 branched by the second beam splitter 41 repeatedly passes through the delay path until entering the second beam splitter 41 again, whereby the pulse width can be expanded.

The combiner 70 includes a beam splitter and the like and combines the laser beam L114 with the laser beam L213. In the planar view orthogonal to the optical axis, the laser beam L114 and the laser beam L213 overlap each other. The laser beam L114 and the laser beam L213 spatially overlapping each other is the laser beam L2. Specifically, the laser beam L114 and the laser beam L213 become the coaxial laser beam L2. With the laser beam L2 combined by the combiner 70, the substrate 100 (see FIG. 1) is irradiated through a mirror 12 and a projection lens 13. Note that, it has been described that the combiner 70 combines the laser beams L114 and L213 at the preceding stage of the projection lens 13, but the position at which the laser beams L114 and L213 are combined is not particularly limited. That is, the irradiation position of the laser beam L114 and the irradiation position of the laser beam L213 are only required to overlap each other on the substrate 100, which is an irradiation object.

In addition, the first laser beam source 11a and the second laser beam source 11b synchronously operate. That is, the laser beam L114 from the first waveform shaping unit 30 and the laser beam L213 from the second waveform shaping unit 40 enter the combiner 70 at the same timing. The substrate 100 is irradiated simultaneously with the laser beam L114 and the laser beam L213.

With such a configuration, it is possible to reduce the polarization-ratio difference between the S-polarization component and the P-polarization component similarly to the first embodiment. Thus, it is possible to evenly irradiate the substrate 100 with the laser beam L2 and to reduce irradiation unevenness. Furthermore, by using the two laser beam sources 11a and 11b, it is possible to increase the irradiation intensity of the laser beam.

Note that, the two laser beam sources 11a and 11b are used to generate the laser beam L100 and the laser beam L200 in the second embodiment, but the two laser beams L100 and L200 may be generated by branching a laser beam from one laser beam source 11. In this case, it is only required to use a non-polarization beam splitter that transmits or reflects a light beam at a certain branching ratio regardless of the polarization state. For example, a non-polarization beam splitter in which the branching ratio between the S-polarization component and the P-polarization component is 50:50 is only required to be used to generate first and second laser beams. Accordingly, it is possible to generate two laser beams having the same polarization state.

In addition, three or more laser beam sources may be used. For example, the configuration in FIG. 2 and the configuration in FIG. 6 may be combined. Alternatively, two sets of configurations in FIG. 2 may be provided. In addition, two sets of configurations in FIG. 6 may be provided.

In addition, in the first embodiment or second embodiment, the half-wave plate 37 or 47 is used as a wave plate to change the polarization state of the laser beam, but a wave plate other than the half-wave plate. For example, a quarter-wave plate may be used to change the polarization state of the laser beam. By replacing the half-wave plate 37 and the half-wave plate 47 with quarter-wave plates, clockwise circular polarization and counterclockwise circular polarization can be delayed similarly. In this case, a quarter-wave plate for returning circular polarization to linear polarization may be disposed on the optical path of the laser beam L2. Alternatively, the substrate 100 may be irradiated with the laser beam L2 containing clockwise circular polarization and counterclockwise circular polarization.

Furthermore, by adjusting the directions of the first beam splitter 31 and the second beam splitter 41, the half-wave plate 37 and the half-wave plate 47 can be omitted. For example, either the first beam splitter 31 or the second beam splitter 41 in FIG. 2 or 6 is rotated around the optical axis by 90°. Specifically, in FIG. 2, the first beam splitter 31 is only required to reflect a part of the laser beam L1 in the upper/lower direction of the sheet of FIG. 5, and the second beam splitter 41 is only required to reflect a part of the laser beam L14 in the direction orthogonal to the sheet of FIG. 5. Accordingly, it is possible to change the polarization ratio between the first and the second polarization components.

Organic EL Display

A semiconductor device including the above poly-silicon film is suitable for a thin film transistor (TFT) array substrate for an organic electro luminescence (EL) display. In other words, the poly-silicon film is used as a semiconductor layer including a source region, a channel region, and a drain region of a TFT.

Figure 7:
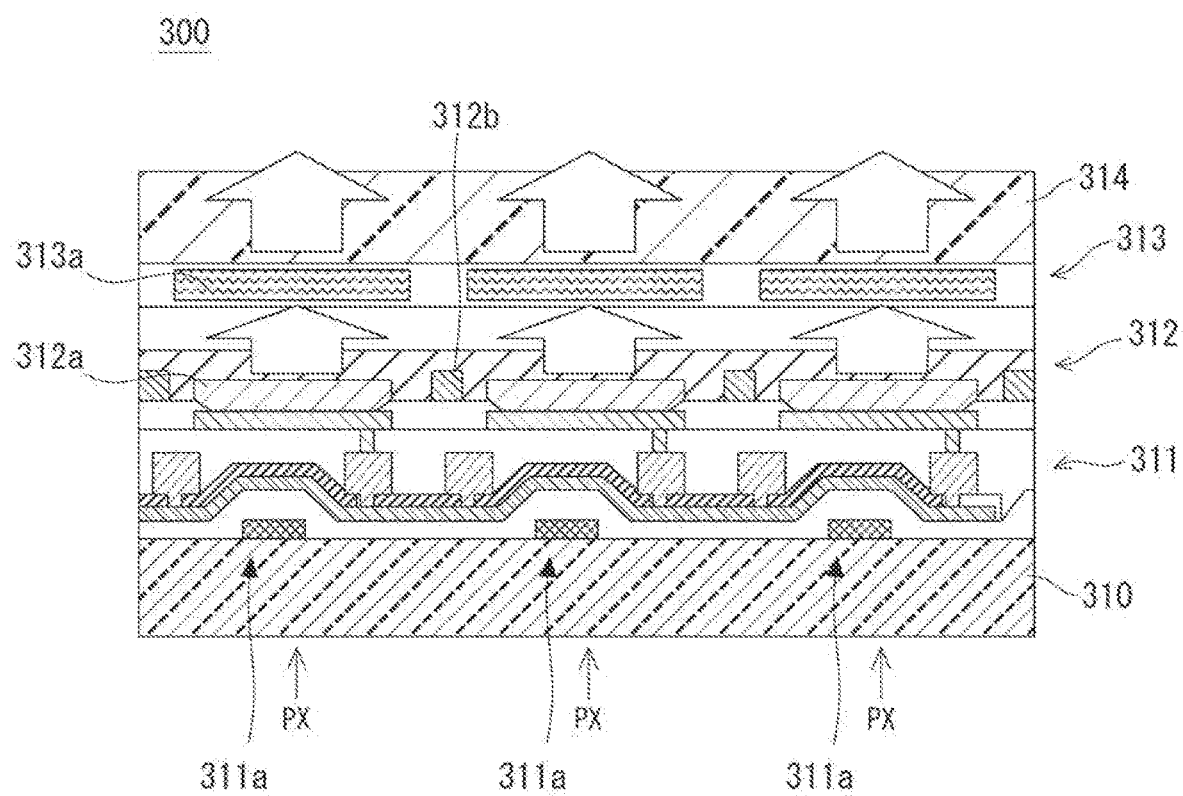
FIG. 7 is a cross-sectional view of an organic EL display a configuration of which is simplified.

The following is a description of a configuration in which a semiconductor device according to the present embodiment is applied to an organic EL display. FIG. 7 is a cross-sectional view of a simplified pixel circuit of an organic EL display. An organic EL display 300 shown in FIG. 7 is an active matrix type display device in which a TFT is disposed in each pixel PX.

The organic EL display 300 includes a substrate 310, a TFT layer 311, an organic layer 312, a color filter layer 313, and a sealing substrate 314. FIG. 17 shows a top emission type organic EL display in which the sealing substrate 314 side is the visible side. Note that, the following description is for a configuration example of an organic EL display, and the present embodiment is not limited to the configuration described in the following. For example, the semiconductor device according to the present embodiment may be used for a bottom emission type organic EL display.

The substrate 310 is a glass substrate or a metal substrate. On the substrate 310, the TFT layer 311 is provided. The TFT layer 311 includes a TFT 311a disposed in each pixel PX. The TFT layer 311 further includes wiring (not shown) connected to the TFT 311a and the like. The TFT 311a, wiring, and the like constitute a pixel circuit.

On the TFT layer 311, the organic layer 312 is provided. The organic layer 312 includes an organic EL light emitting device 312a disposed in each pixel PX. The organic EL light emitting device 312a has a lamination structure in which, for example, an anode, a hole injection layer, a hole transport layer, a light emission layer, an electron transport layer, an electron injection layer, and a cathode are laminated. In the case of a top emission type, the anode is a metal electrode, and the cathode is a transparent conducting layer, such as indium tin oxide (ITO). In addition, the organic layer 312 is provided with a partition wall 312b between adjacent pixels PX to separate the organic EL light emitting device 312a.

On the organic layer 312, the color filter layer 313 is provided. The color filter layer 313 is provided with color filter 313a for color display. In other words, a resin layer colored in R (red), G (green), or B (blue) is provided as the color filter 313a in each pixel PX. White light emitted from the organic layer 312 passes through the color filter 313a and is converted into RGB color light. Note that, in the case of a three color type in which the organic layer 312 is provided with an organic EL light emitting device that emits light in RGB colors, the color filter layer 313 may be omitted.

On the color filter layer 313, the sealing substrate 314 is provided. The sealing substrate 314 is a transparent substrate, such as a glass substrate, and is provided to prevent deterioration of the organic EL light emitting device of the organic layer 312.

The current flowing through the organic EL light emitting device 312a of the organic layer 312 is changed depending on a display signal supplied to the pixel circuit. Thus, by supplying a display signal according to a display image to each pixel PX, it is possible to control the light emission amount at each pixel PX. Accordingly, it is possible to display a desired image.

In an active matrix type display device, such as an organic EL display, one or more TFTs (for example, switching TFTs or driving TFTs) are provided in one pixel PX. Then, a TFT in each pixel PX is provided with a semiconductor layer including a source region, a channel region, and a drain region. The poly-silicon film according to the present embodiment is suitable for a semiconductor layer of the TFT. In other words, by using the poly-silicon film manufactured by the above manufacturing method for a TFT array substrate for a semiconductor layer, it is possible to prevent in-plane variation in TFT characteristics. Thus, it is possible to manufacture a display device having satisfactory display characteristics with high productivity.

Semiconductor Device Manufacturing Method

A semiconductor device manufacturing method using the ELA apparatus according to the present embodiment is suitable for manufacturing a TFT array substrate. A method for manufacturing a semiconductor device including a TFT is described with reference to FIGS. 8 to 15. FIGS. 8 to 15 are cross-sectional views showing processes for manufacturing a semiconductor device. In the following, a method for manufacturing a semiconductor device including an inverted staggered type TFT is described.

Figure 8:
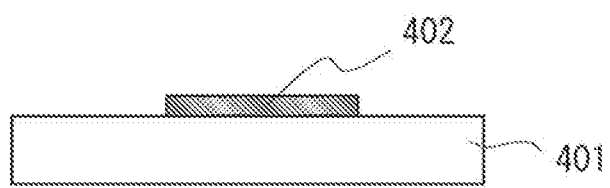
FIG. 8 is a cross-sectional view showing a process of a semiconductor device manufacturing method according to the present embodiment.

First, as shown in FIG. 8, a gate electrode 402 is formed on a glass substrate 401. Note that, the glass substrate 401 is equivalent to the substrate 100 described above. As the gate electrode 402, a metallic thin film containing, for example, aluminium or the like can be used. On the glass substrate 401, a metallic thin film is deposited by spattering or vapor deposition. Then, the metallic thin film is patterned by photolithography to form the gate electrode 402. In photolithography, resist coating, exposure, development, etching, resist stripping, and the like are performed. Note that, various types of wiring may be formed in the same step when the gate electrode 402 is patterned.

Figure 9:
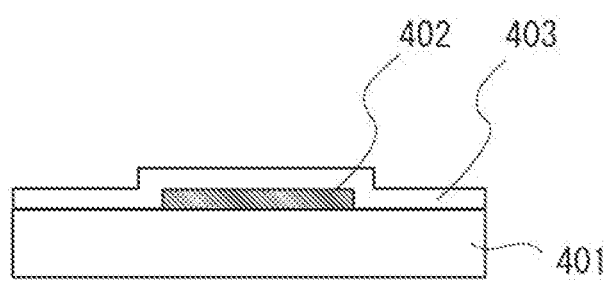
FIG. 9 is a cross-sectional view showing a process of the semiconductor device manufacturing method according to the present embodiment.
Figure 10:
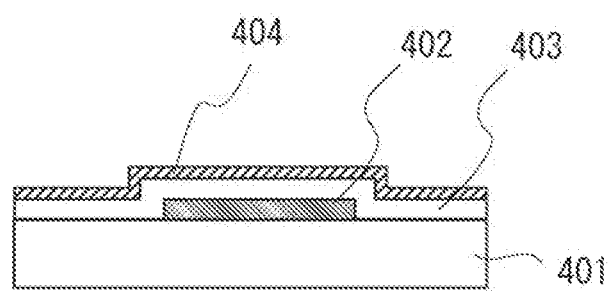
FIG. 10 is a cross-sectional view showing a process of the semiconductor device manufacturing method according to the present embodiment.

Next, as shown in FIG. 9, on the gate electrode 402, a gate insulating film 403 is formed. The gate insulating film 403 is formed to cover the gate electrode 402. Then, on the gate insulating film 403, an amorphous silicon film 404 is formed as shown in FIG. 10. The amorphous silicon film 404 is disposed to overlap the gate electrode 402 with the gate insulating film 403 interposed therebetween.

The gate insulating film 403 is a silicon nitride film ($SiN_x$), a silicon oxide film ($SiO_2$ film), a lamination film thereof, or the like. Specifically, by chemical vapor deposition (CVD), the gate insulating film 403 and the amorphous silicon film 404 are successively deposited.

Figure 11:
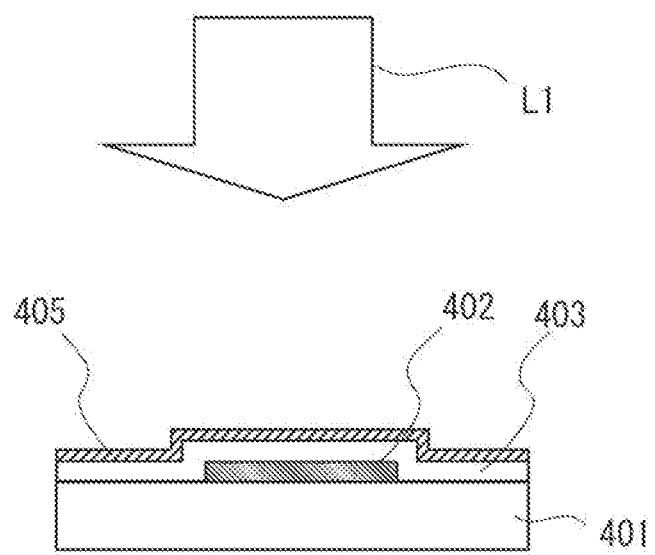
FIG. 11 is a cross-sectional view showing a process of the semiconductor device manufacturing method according to the present embodiment.

Then, the amorphous silicon film 404 is irradiated with the laser beam L1 to form a poly-silicon film 405 as shown in FIG. 11. In other words, the amorphous silicon film 404 is crystallized by the ELA apparatus 1 shown in FIG. 1 and the like. Accordingly, the poly-silicon film 405 in which silicon is crystallized is formed on the gate insulating film 403. The poly-silicon film 405 is equivalent to the poly-silicon film 101b described above.

At this time, by an inspection method according to the present embodiment, the poly-silicon film 405 is inspected. If the poly-silicon film 405 does not meet predetermined criteria, the poly-silicon film 405 is irradiated with a laser beam again. Accordingly, it is possible to make the characteristics of the poly-silicon film 405 more even. It is possible to prevent in-plane variation and to manufacture a display device having satisfactory display characteristics with high productivity.

Note that, although not shown, the poly-silicon film 405 is patterned by photolithography. In addition, impurities may be introduced into the poly-silicon film 405 by ion implantation.

Figure 12:
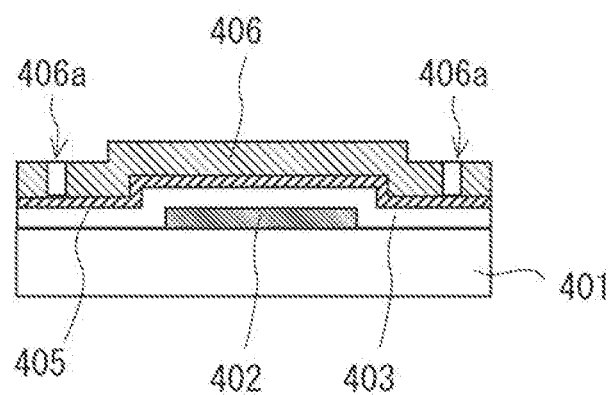
FIG. 12 is a cross-sectional view showing a process of the semiconductor device manufacturing method according to the present embodiment.

Then, on the poly-silicon film 405, an interlayer insulating film 406 is formed as shown in FIG. 12. The interlayer insulating film 406 is provided with a contact hole 406a for exposing the poly-silicon film 405.

The interlayer insulating film 406 is a silicon nitride film (SiN$_x$), a silicon oxide film (SiO$_2$ film), a lamination film thereof, or the like. Specifically, the interlayer insulating film 406 is deposited by CVD. Then, the interlayer insulating film 406 is patterned by photolithography to form the contact hole 406a.

Figure 13:
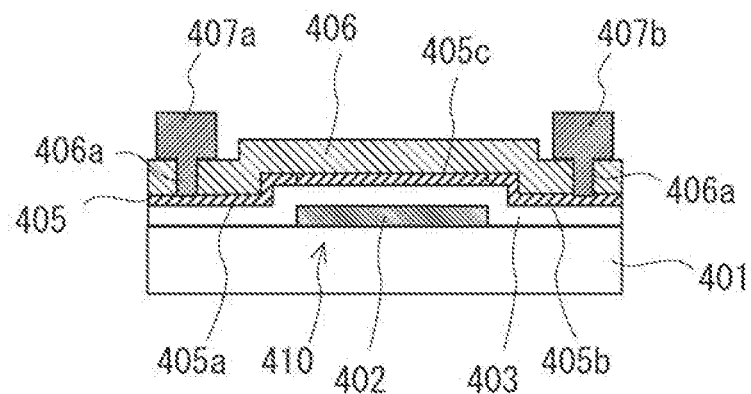
FIG. 13 is a cross-sectional view showing a process of the semiconductor device manufacturing method according to the present embodiment.

Next, on the interlayer insulating film 406, a source electrode 407a and a drain electrode 407b are formed as shown in FIG. 13. The source electrode 407a and the drain electrode 407b are each formed to cover the contact hole 406a. In other words, the source electrode 407a and the drain electrode 407b are each formed in the contact hole 406a and over the interlayer insulating film 406. Thus, the source electrode 407a and the drain electrode 407b are electrically connected to the poly-silicon film 405 via the contact hole 406a.

With these processes, a TFT 410 is formed. The TFT 410 is equivalent to the TFT 311a described above. In the poly-silicon film 405, a region overlapping the gate electrode 402 is a channel region 405c. In the poly-silicon film 405, a region on the source electrode 407a side from the channel region 405c is a source region 405a, and a region on the drain electrode 407b side is a drain region 405b.

The source electrode 407a and the drain electrode 407b are each formed of a metallic thin film containing aluminium or the like. On the interlayer insulating film 406, a metallic thin film is deposited by spattering or vapor deposition. Then, the metallic thin film is patterned by photolithography to form the source electrode 407a and the drain electrode 407b. Note that, various types of wiring may be formed in the same step when the source electrode 407a and the drain electrode 407b are patterned.

Figure 14:
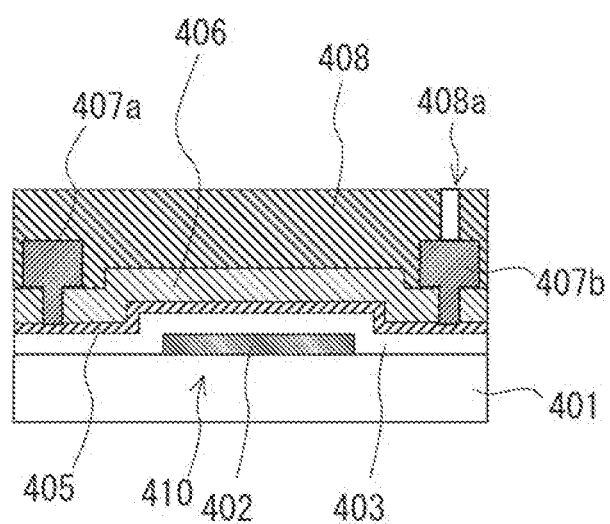
FIG. 14 is a cross-sectional view showing a process of the semiconductor device manufacturing method according to the present embodiment.

Then, on the source electrode 407a and the drain electrode 407b, a planarizing film 408 is formed as shown in FIG. 14. The planarizing film 408 is formed to cover the source electrode 407a and the drain electrode 407b. In addition, the planarizing film 408 is provided with a contact hole 408a for exposing the drain electrode 407b.

The planarizing film 408 is formed of, for example, a photosensitive resin film. On the source electrode 407a and the drain electrode 407b, a photosensitive resin film is coated, exposed, and developed. Accordingly, it is possible to pattern the planarizing film 408 including the contact hole 408a.

Figure 15:
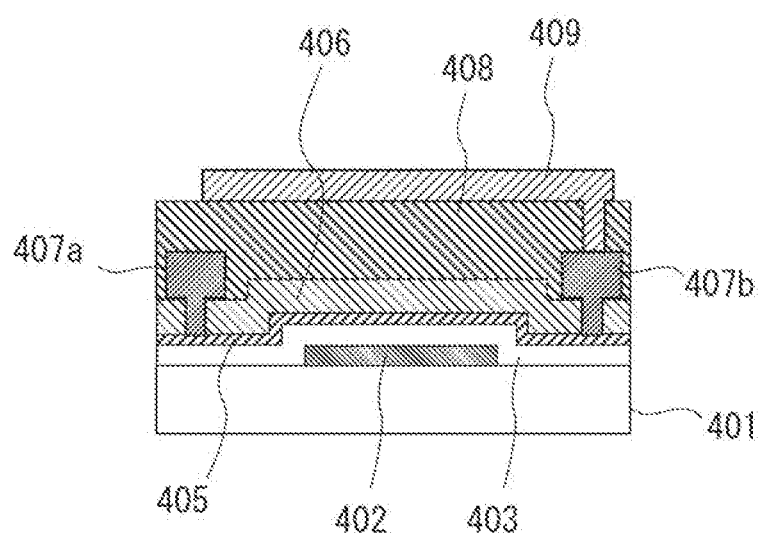
FIG. 15 is a cross-sectional view showing a process of the semiconductor device manufacturing method according to the present embodiment.

Then, on the planarizing film 408, a pixel electrode 409 is formed as shown in FIG. 15. The pixel electrode 409 is formed to cover the contact hole 408a. In other words, the pixel electrode 409 is formed in the contact hole 408a and over the planarizing film 408. Thus, the pixel electrode 409 is electrically connected to the drain electrode 407b via the contact hole 408a.

The pixel electrode 409 is formed of a transparent conducting layer or a metallic thin film containing aluminium or the like. On the planarizing film 408, a conducting layer (a transparent conducting layer or a metallic thin film) is deposited by spattering or the like. Then, the conducting layer is patterned by photolithography. Accordingly, the pixel electrode 409 is formed on the planarizing film 408. In the case of a driving TFT for an organic EL display, the organic EL light emitting device 312a, the color filter (CF) 313a, and the like as shown in FIG. 7 are formed on the pixel electrode 409. Note that, in the case of a top emission type organic EL display, the pixel electrode 409 is formed of a metallic thin film containing aluminium or silver having high reflectance. In the case of a bottom emission type organic EL display, the pixel electrode 409 is formed of a transparent conducting layer, such as ITO.

The processes for manufacturing an inverted staggered type TFT have been described, but the manufacturing method according to the present embodiment may be applied to the manufacture of an inverted staggered type TFT. Naturally, the method for manufacturing a TFT is not limited to the manufacture of a TFT for an organic EL display and is applicable to the manufacture of a TFT for a liquid crystal display (LCD).

In addition, it has been described that the laser annealing apparatus according to the present embodiment irradiates an amorphous silicon film with a laser beam to form a poly-silicon film, but an amorphous silicon film may be irradiated with a laser beam to form a microcrystal silicon film. Furthermore, a laser beam for annealing is not limited to excimer laser. Moreover, the method according to the present embodiment is applicable to a laser annealing apparatus that crystallizes a thin film other than a silicon film. In other words, as long as a laser annealing apparatus irradiates an amorphous film with a laser beam to form a crystallized film, the method according to the present embodiment is applicable. With the laser annealing apparatus according to the present embodiment, it is possible to appropriately inspect a substrate with crystallized film.

Note that, the present invention is not limited to the above embodiments and can be modified without departing from the scope thereof.

This application is based upon and claims the benefit of priority from Japanese Patent Application No. 2019-77707, filed on Apr. 16, 2019, the disclosure of which is incorporated herein in its entirety by reference.

REFERENCE SIGNS LIST

1 ELA apparatus
11 Laser beam source
11a First laser beam source
11b Second laser beam source
12 Mirror
13 Projection lens
20 Waveform shaping device 30 First waveform shaping unit
31 First beam splitter
32 to 35 Mirror
37 Half-wave plate
40 Second waveform shaping unit
41 Second beam splitter
42 to 45 Mirror
47 Half-wave plate
100 Substrate
101 Silicon film
101a Amorphous silicon film 101a
101b Poly-silicon film 101b
300 Organic EL display
310 Substrate
311 TFT layer
311a TFT
312 Organic layer
312a Organic EL light emitting device
312b Partition wall
313 Color filter layer
313a Color filter (CF)
314 Sealing substrate
401 Glass substrate
402 Gate electrode
403 Gate insulating film
404 Amorphous silicon film
405 Poly-silicon film
406 Interlayer insulating film
407a Source electrode
407b Drain electrode
408 Planarizing film
409 Pixel electrode
410 TFT
PX Pixel

The invention claimed is:

1. A laser irradiation apparatus comprising:
a laser beam source configured to generate a pulse laser beam;
a first waveform shaping unit including a first beam splitter configured to branch the pulse laser beam, the first waveform shaping unit being configured to shape a pulse waveform of the pulse laser beam by applying a delay according to an optical path length difference between two light beams branched by the first beam splitter;
a wave plate configured to change a polarization state of the pulse laser beam from the first waveform shaping unit; and
a second waveform shaping unit including a second beam splitter configured to branch the pulse laser beam from the wave plate, the second waveform shaping unit being configured to shape the pulse waveform of the pulse laser beam by applying a delay according to an optical path length difference between two light beams branched by the second beam splitter.

2. The laser irradiation apparatus according to claim 1, wherein
the pulse laser beam is branched into a first light beam and a second light beam by the first beam splitter reflecting a part of the pulse laser beam and transmitting a part of the pulse laser beam,
the first waveform shaping unit includes a plurality of mirrors configured to reflect the second light beam in such a manner that an optical path length of the second light beam is longer than an optical path length of the first light beam,
the first beam splitter is configured to combine the second light beam reflected by the plurality of mirrors with the first light beam,
the pulse laser beam is branched into a third light beam and a fourth light beam by the second beam splitter reflecting a part of the pulse laser beam and transmitting a part of the pulse laser beam,
the second waveform shaping unit includes a plurality of mirrors configured to reflect the fourth light beam in such a manner that an optical path length of the fourth light beam is longer than an optical path length of the third light beam, and
the second beam splitter is configured to combine the fourth light beam reflected by the plurality of mirrors with the third light beam.

3. A laser irradiation apparatus comprising:
a laser beam source configured to generate a first pulse laser beam and a second pulse laser beam;
a first waveform shaping unit including a first beam splitter configured to branch the first pulse laser beam, the first waveform shaping unit being configured to shape a pulse waveform of the first pulse laser beam by applying a delay according to an optical path length difference between two light beams branched by the first beam splitter;
a first wave plate configured to change a polarization state of the first pulse laser beam from the first waveform shaping unit;
a second wave plate configured to change a polarization state of the second pulse laser beam from the laser beam source;
a second waveform shaping unit including a second beam splitter configured to branch the second pulse laser beam from the second wave plate, the second waveform shaping unit being configured to shape a pulse waveform of the second pulse laser beam by applying a delay according to an optical path length difference between two light beams branched by the second beam splitter; and
a combiner configured to combine the first pulse laser beam from the first wave plate with the second pulse laser beam from the second waveform shaping unit.

4. The laser irradiation apparatus according to claim 3, wherein
the first pulse laser beam is branched into a first light beam and a second light beam by the first beam splitter reflecting a part of the first pulse laser beam and transmitting a part of the first pulse laser beam,
the first waveform shaping unit includes a plurality of mirrors configured to reflect the second light beam in such a manner that an optical path length of the second light beam is longer than an optical path length of the first light beam,
the first beam splitter is configured to combine the second light beam reflected by the plurality of mirrors with the first light beam,
the second pulse laser beam is branched into a third light beam and a fourth light beam by the second beam splitter reflecting a part of the second pulse laser beam and transmitting a part of the second pulse laser beam,
the second waveform shaping unit includes a plurality of mirrors configured to reflect the fourth light beam in such a manner that an optical path length of the fourth light beam is longer than an optical path length of the third light beam, and the second beam splitter is configured to combine the fourth light beam reflected by the plurality of mirrors with the third light beam.

5. The laser irradiation apparatus according to claim 1, wherein when intensity of a P-polarization component and intensity of an S-polarization component of the pulse laser beam with which an object is to be irradiated are normalized by pulse energy, an intensity difference between the P-polarization component and the S-polarization component is less than 12%.

6. The laser irradiation apparatus according to claim 1, further comprising a means for converting the pulse laser beam with which an object is to be irradiated into a line beam.

7. The laser irradiation apparatus according to claim 1, wherein an amorphous film is irradiated with the pulse laser beam while an irradiation position of the pulse laser beam on an object is changed, whereby the amorphous film is crystalized to form a crystallized film.

8. A laser irradiation method comprising the steps of:
(A) generating a pulse laser beam;
(B) branching the pulse laser beam into two light beams by a first beam splitter;
(C) shaping a pulse waveform of the pulse laser beam by applying a delay according to an optical path length difference between the two light beams branched by the first beam splitter;
(D) changing, after the step (C), a polarization state of the pulse laser beam by a wave plate;
(E) branching the pulse laser beam from the wave plate into two light beams by a second beam splitter; and
(F) shaping the pulse waveform of the pulse laser beam by applying a delay according to an optical path length difference between the two light beams branched by the second beam splitter.

9. The laser irradiation method according to claim 8, wherein
the step (B) includes branching the pulse laser beam into a first light beam and a second light beam by the first beam splitter reflecting a part of the pulse laser beam and transmitting a part of the pulse laser beam,
the step (C) includes:
reflecting the second light beam by a plurality of mirrors in such a manner that an optical path length of the second light beam is longer than an optical path length of the first light beam; and
combining, by the first beam splitter, the second light beam reflected by the plurality of mirrors with the first light beam,
the step (E) includes branching the pulse laser beam into a third light beam and a fourth light beam by the second beam splitter reflecting a part of the pulse laser beam and transmitting a part of the pulse laser beam, and
the step (F) includes:
reflecting the fourth light beam by a plurality of mirrors in such a manner that an optical path length of the fourth light beam is longer than an optical path length of the third light beam, and
combining, by the second beam splitter, the fourth light beam reflected by the plurality of mirrors with the third light beam.

10. A laser irradiation method comprising the steps of:
(a) generating a first pulse laser beam and a second pulse laser beam;
(b) branching the first pulse laser beam into two light beams by a first beam splitter;
(c) shaping a pulse waveform of the first pulse laser beam by applying a delay according to an optical path length difference between the two light beams branched by the first beam splitter;
(d) changing, after the step (c), a polarization state of the first pulse laser beam by a first wave plate;
(e) changing a polarization state of the second pulse laser beam by a second wave plate;
(f) branching, after the step (e), the second pulse laser beam into two light beams by a second beam splitter;
(g) shaping a pulse waveform of the second pulse laser beam by applying a delay according to an optical path length difference between the two light beams branched by the second beam splitter; and
(h) combining the first and second pulse laser beams having the shaped pulse waveforms.

11. The laser irradiation method according to claim 10, wherein
the step (b) includes branching the first pulse laser beam into a first light beam and a second light beam by the first beam splitter reflecting a part of the first pulse laser beam and transmitting a part of the first pulse laser beam,
the step (c) includes:
reflecting the second light beam by a plurality of mirrors in such a manner that an optical path length of the second light beam is longer than an optical path length of the first light beam; and
combining, by the first beam splitter, the second light beam reflected by the plurality of mirrors with the first light beam,
the step (f) includes branching the second pulse laser beam into a third light beam and a fourth light beam by the second beam splitter reflecting a part of the second pulse laser beam and transmitting a part of the second pulse laser beam, and
the step (g) includes:
reflecting the fourth light beam by a plurality of mirrors in such a manner that an optical path length of the fourth light beam is longer than an optical path length of the third light beam; and
combining, by the second beam splitter, the fourth light beam reflected by the plurality of mirrors with the third light beam.

12. The laser irradiation method according to claim 8, wherein when intensity of a P-polarization component and intensity of an S-polarization component of the pulse laser beam with which an object is to be irradiated are normalized by pulse energy, an intensity difference between the P-polarization component and the S-polarization component is less than 12%.

13. The laser irradiation method according to claim 8, wherein the pulse laser beam is converted into a line beam to irradiate an object.

14. The laser irradiation method according to claim 8, wherein an amorphous film is irradiated with the pulse laser beam while an irradiation position of the pulse laser beam on an object is changed, whereby the amorphous film is crystalized to form a crystallized film.

15. A semiconductor device manufacturing method comprising the steps of:
(S1) forming an amorphous film on a substrate; and
(S2) irradiating the amorphous film with a pulse laser beam in such a manner as to form a crystallized film by crystallizing the amorphous film, wherein the step (S2) includes the steps of:
(SA) generating a pulse laser beam;
(SB) branching the pulse laser beam into two light beams by a first beam splitter;
(SC) shaping a pulse waveform of the pulse laser beam by applying a delay according to an optical path length difference between the two light beams branched by the first beam splitter;
(SD) changing, after the step (SC), a polarization state of the pulse laser beam by a wave plate;
(SE) branching the pulse laser beam from the wave plate into two light beams by a second beam splitter; and
(SF) shaping the pulse waveform of the pulse laser beam by applying a delay according to an optical path length difference between the two light beams branched by the second beam splitter.

16. The semiconductor device manufacturing method according to claim 15, wherein
the step (SB) includes branching the pulse laser beam into a first light beam and a second light beam by the first beam splitter reflecting a part of the pulse laser beam and transmitting a part of the pulse laser beam,
the step (SC) includes:
reflecting the second light beam by a plurality of mirrors in such a manner that an optical path length of the second light beam is longer than an optical path length of the first light beam; and
combining, by the first beam splitter, the second light beam reflected by the plurality of mirrors with the first light beam,
the step (SE) includes branching the pulse laser beam into a third light beam and a fourth light beam by the second beam splitter reflecting a part of the pulse laser beam and transmitting a part of the pulse laser beam, and
the step (SF) includes:
reflecting the fourth light beam by a plurality of mirrors in such a manner that an optical path length of the fourth light beam is longer than an optical path length of the third light beam, and
combining, by the second beam splitter, the fourth light beam reflected by the plurality of mirrors with the third light beam.

17. A semiconductor device manufacturing method comprising the steps of:
(S1) forming an amorphous film on a substrate; and
(S2) irradiating the amorphous film with a pulse laser beam in such a manner as to form a crystallized film by crystallizing the amorphous film, wherein
the step (S2) includes the steps of:
(sa) generating a first pulse laser beam and a second pulse laser beam;
(sb) branching the first pulse laser beam into two light beams by a first beam splitter;
(sc) shaping a pulse waveform of the first pulse laser beam by applying a delay according to an optical path length difference between the two light beams branched by the first beam splitter;
(sd) changing, after the step (sc), a polarization state of the first pulse laser beam by a first wave plate;
(se) changing a polarization state of the second pulse laser beam by a second wave plate;
(sf) branching, after the step (se), the second pulse laser beam into two light beams by a second beam splitter;
(sg) shaping a pulse waveform of the second pulse laser beam by applying a delay according to an optical path length difference between the two light beams branched by the second beam splitter; and
(sh) combining the first and second pulse laser beams having the shaped pulse waveforms.

18. The semiconductor device manufacturing method according to claim 17, wherein
the step (sb) includes branching the first pulse laser beam into a first light beam and a second light beam by the first beam splitter reflecting a part of the first pulse laser beam and transmitting a part of the first pulse laser beam,
the step (sc) includes:
reflecting the second light beam by a plurality of mirrors in such a manner that an optical path length of the second light beam is longer than an optical path length of the first light beam; and
combining, by the first beam splitter, the second light beam reflected by the plurality of mirrors with the first light beam,
the step (sf) includes branching the second pulse laser beam into a third light beam and a fourth light beam by the second beam splitter reflecting a part of the second pulse laser beam and transmitting a part of the second pulse laser beam, and
the step (sg) includes:
reflecting the fourth light beam by a plurality of mirrors in such a manner that an optical path length of the fourth light beam is longer than an optical path length of the third light beam; and
combining, by the second beam splitter, the fourth light beam reflected by the plurality of mirrors with the third light beam.

19. The semiconductor device manufacturing method according to claim 15, wherein when intensity of a P-polarization component and intensity of an S-polarization component of the pulse laser beam with which an object is to be irradiated are normalized by pulse energy, an intensity difference between the P-polarization component and the S-polarization component is less than 12%.

20. The semiconductor device manufacturing method according to claim 15, wherein the pulse laser beam is converted into a line beam to irradiate the amorphous film.

21. The semiconductor device manufacturing method according to claim 15, wherein the step (S2) includes irradiating the amorphous film with the pulse laser beam while changing an irradiation position of the pulse laser beam on an object is changed whereby the amorphous film is crystalized to form a crystallized film.

* * * * *